(12) United States Patent
Sabina

(10) Patent No.: US 11,585,857 B2
(45) Date of Patent: Feb. 21, 2023

(54) METHOD FOR DETERMINING THE STATE OF A VEHICLE BY DETECTING THE VEHICLE BATTERY VOLTAGE

(71) Applicant: OCTO TELEMATICS S.p.A., Rome (IT)

(72) Inventor: Simone Sabina, Rome (IT)

(73) Assignee: OCTO TELEMATICS S.P.A., Rome (IT)

( * ) Notice: Subject to any disclaimer, the term of this patent is extended or adjusted under 35 U.S.C. 154(b) by 1090 days.

(21) Appl. No.: 16/314,029

(22) PCT Filed: Jun. 30, 2017

(86) PCT No.: PCT/IB2017/053948
§ 371 (c)(1),
(2) Date: Dec. 28, 2018

(87) PCT Pub. No.: WO2018/002889
PCT Pub. Date: Jan. 4, 2018

(65) Prior Publication Data
US 2019/0324092 A1 Oct. 24, 2019

(30) Foreign Application Priority Data

Jul. 1, 2016 (IT) .................. 102016000068348

(51) Int. Cl.
*G01R 31/3835* (2019.01)
*G01R 31/367* (2019.01)
*G01R 19/00* (2006.01)
*G01R 19/165* (2006.01)
*G07C 5/02* (2006.01)
*B60W 40/107* (2012.01)

(52) U.S. Cl.
CPC ....... *G01R 31/3835* (2019.01); *G01R 19/003* (2013.01); *G01R 19/16528* (2013.01); *G01R 31/367* (2019.01); *B60W 40/107* (2013.01); *G07C 5/02* (2013.01)

(58) Field of Classification Search
None
See application file for complete search history.

(56) References Cited

U.S. PATENT DOCUMENTS 8,805,639 B1* 8/2014 Musicant ................. G07C 5/08
702/141
9,934,622 B2* 4/2018 Rajakondala ............. G01P 1/06
(Continued)

*Primary Examiner* — Brent A. Fairbanks
(74) *Attorney, Agent, or Firm* — Squire Patton Boggs (US) LLP

(57) ABSTRACT

A method is described for determining the state of a vehicle equipped with an electric charge accumulator assembly adapted to power at least one starter device of a thermal engine and/or accessory devices of the vehicle and rechargeable by means of the kinetic energy of said engine, including the detection of the voltage available across the electric charge accumulator assembly of the vehicle in a predetermined succession of moments in time; at least one binary classification of the voltage value available across the accumulator assembly by comparison with a reference voltage value; and the determination of the operating state of the vehicle as a function of the outcome of the binary classification of the value of the voltage available across the accumulator assembly.

10 Claims, 5 Drawing Sheets

(56) References Cited

U.S. PATENT DOCUMENTS

| | | | | |
|---|---|---|---|---|
| 2007/0127825 A1* | 6/2007 | Ivanov | ............... | G06K 9/6256 |
| | | | | 382/228 |
| 2012/0067113 A1* | 3/2012 | Jaffe | ................. | G01M 15/02 |
| | | | | 73/114.62 |
| 2013/0052614 A1* | 2/2013 | Mollicone | ............ | G09B 19/167 |
| | | | | 434/65 |
| 2014/0114885 A1* | 4/2014 | Han | ..................... | G06N 20/10 |
| | | | | 706/20 |
| 2015/0035665 A1* | 2/2015 | Plante | .................. | G07C 5/008 |
| | | | | 340/438 |
| 2015/0154816 A1* | 6/2015 | Chen | ................... | G07C 5/0825 |
| | | | | 701/29.1 |
| 2015/0298630 A1* | 10/2015 | Iwai | ................ | G01R 31/3644 |
| | | | | 324/426 |
| 2016/0049018 A1* | 2/2016 | Groß | ..................... | G07C 5/02 |
| | | | | 701/99 |

* cited by examiner

METHOD FOR DETERMINING THE STATE OF A VEHICLE BY DETECTING THE VEHICLE BATTERY VOLTAGE

CROSS-REFERENCE TO RELATED APPLICATIONS

This application is the U.S. National Stage Application of International Patent Application No. PCT/IB2017/053948, filed on Jun. 30, 2017, which claims priority to Italian Patent Application No. 102016000068348, filed on Jul. 1, 2016, the contents of each of which is incorporated herein by reference in its entirety.

FIELD OF THE INVENTION

The present invention relates to the automotive sector and specifically to the technical field of onboard devices for detecting data relating to the motion and driving parameters of a vehicle.

Specifically, the invention relates to a method for determining the state of a vehicle according to the preamble of claim 1.

STATE OF THE ART

Onboard detection devices are known, in particular for the real-time acquisition and remote transmission of motion and driving parameters of a vehicle, which not only contribute to the operation of onboard systems for driving assistance but are indispensable for the functionality of other auxiliary systems, including, for example, the vehicle's use dynamics surveillance and recording systems, such as systems used in anti-theft devices, in monitoring devices for vehicles belonging to a fleet or in devices, known as black boxes, for detecting traffic offenses or road accidents, dynamics such as for law enforcement or insurance companies.

Typically, a system for monitoring and recording the vehicle's dynamics of use is provided to detect the vehicle's driving conditions (driving speed, overall driving time, engine speed) in view of transmitting them to a remote analysis station. The data may be transferred periodically to the analysis station via an onboard communication system or simply recorded to a non-transitory storage medium available onboard the vehicle from where the data may be retrieved later, for example, when the vehicle is subjected to a scheduled periodic maintenance intervention.

In both cases described above, the surveillance system is designed to record, without distinction and continuously, every driving event and every interval of inactivity of the vehicle. The state of the vehicle, that is, the condition of activity (operation) or inactivity of the vehicle's engine, is important information because it is related to the vehicle's use or non-use events that represent important data in checking the conditions of use of a vehicle in the long run, for example in checking the operation of vehicles belonging to a fleet. In fact, in the event that the vehicle engine is in operation, it may be deduced that the vehicle is running (running meaning a driving condition of the vehicle, including temporary stops, but excluding prolonged parking) while in the case wherein the engine of a vehicle is not in operation it may be deduced that the vehicle is parked.

There are vehicles that from their production integrate onboard devices for the detection of motion and driving parameters of vehicles adapted to determine the state of the vehicle by means of a physical link with the ignition and key start switch device or the CAN bus of the vehicle. If these devices are not provided at the time of the vehicle's production, or if the vehicle is not equipped with a conventional ignition and key start switch device, it is not always possible or convenient (in terms of difficulty and reliability of the intervention) to make use of a physical link with the key signal or the CAN bus to determine the vehicle's state.

SUMMARY OF THE INVENTION

The object of the present description is to provide a method for determining the state of a vehicle that allows the above-described disadvantages to be overcome. In particular, the present invention aims to provide a solution to the problem of checking a vehicle's state in the absence of a physical link with a key signal derived from a vehicle ignition and key start switch device.

According to the present invention, such object is achieved by a method for determining the state of a vehicle having the features recited in claim 1.

Particular embodiments are subject of the dependent claims, the content of which is to be understood as an integral part of the present description.

A further subject of the invention is an onboard device for detecting data relating to the motion and driving parameters of a vehicle and a computer program or group of programs executable by a processing system of an onboard device, as claimed.

In summary, the present invention is based on the principle that the voltage established across a vehicle's electric charge accumulator assembly (battery), used for starting up a thermal engine of the vehicle (equipped only with a thermal engine or with a thermal engine in combination with another motor), and/or for powering vehicle's accessory devices, and rechargable by the kinetic energy of the engine, has a variable behavior over time according to the aforementioned conditions, which is representative of the state (i.e. of activity or inactivity) of the engine and may be considered as indicative of the state of the vehicle.

Advantageously, different criteria are proposed for analyzing the values of the voltage established across an electric charge accumulator assembly (battery) of the vehicle, useful for determining or estimating the state of the vehicle.

Further features and advantages of the invention will be described in greater detail in the following detailed description of one embodiment thereof, given by way of non-limiting example, with reference to the accompanying drawings concisely described in the subsequent paragraph.

DETAILED DESCRIPTION

Figure 1:
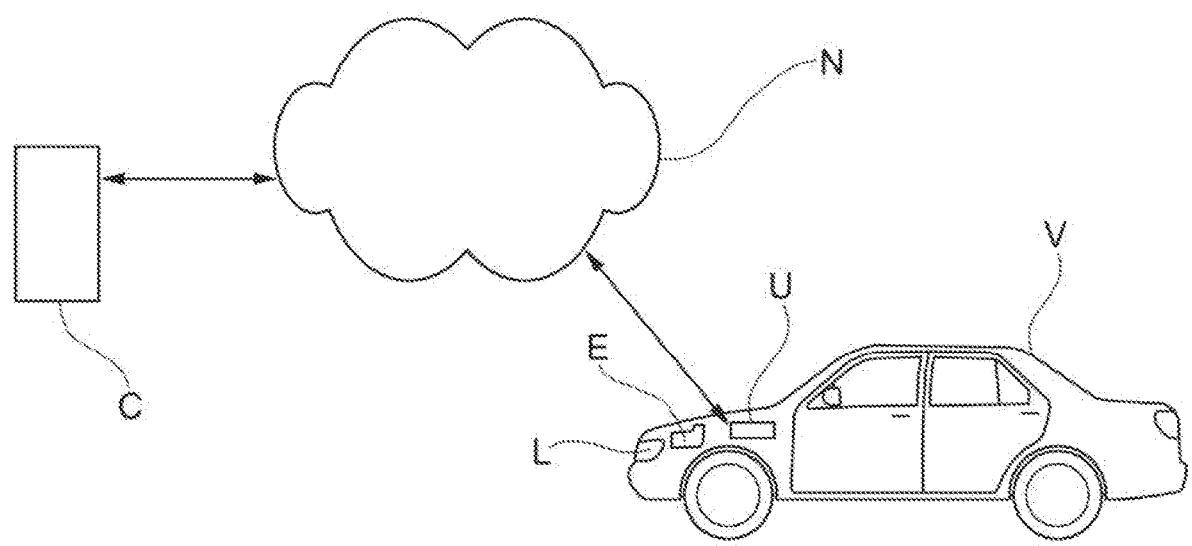
FIG. 1 is a schematic representation of the context of application of the present invention.

FIG. 1 shows the context of application of the present invention.

In FIG. 1, a generic vehicle is indicated at V, such as a private car or a vehicle belonging to a fleet of company vehicles. The vehicle V is equipped with a thermal engine E and an electric charge accumulator assembly, known simply as a battery, indicated at B (see FIG. 3), which controls the startup of the thermal engine and/or the power supply of the vehicle's accessories such as the lighting devices L, and is rechargeable by means of the kinetic energy of the engine, typically by means of an alternator A (see FIG. 3).

An onboard device for detecting data relating to the motion and driving parameters of the vehicle, in particular for the real-time acquisition and remote transmission of said data, is indicated at U. This device is arranged for processing data relating to motion and driving parameters of the vehicle and for transmitting said data to a remote central unit C, for example through a public telecommunication network N.

By way of example and for the objects of the present invention, the data relating to the motion and driving parameters of the vehicle are data indicative of the travel time of the vehicle. The travel time, calculated from a detected travel start time to a detected travel end time, is a useful item of data—for example—for checking the conditions of use of a vehicle and possibly for the provision of various services related to the use of a vehicle. Conventionally, the travel start time is detected at a transition of the state of the vehicle from an inactive or rest state (hereinafter referred to as OFF) to a condition of activity or running (hereinafter referred to as ON). Likewise, the travel end time is detected at a transition of the state of the vehicle from an active or running state (ON) to an inactive or rest state (OFF).

Figure 2:
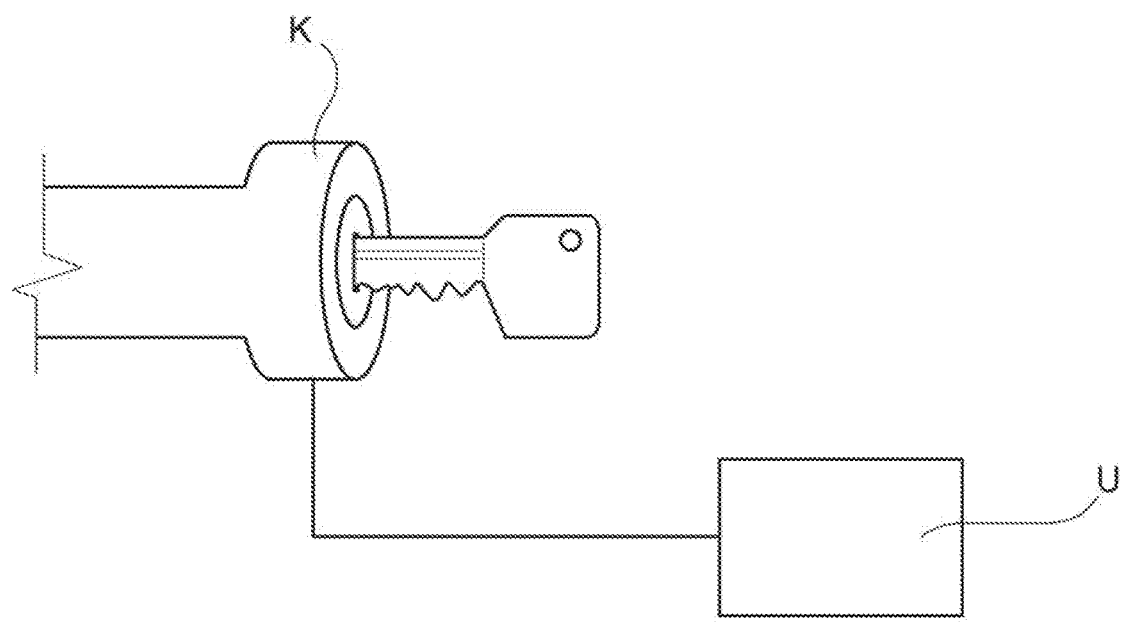
FIG. 2 is a schematic representation of a coupling configuration onboard a vehicle of a device for detecting data relating to the motion and driving parameters of a vehicle by means of a physical link to the ignition and key start switch device of the vehicle, according to the prior art.

FIG. 2 shows a typical configuration of the prior art of coupling on board a vehicle a device for detecting data relating to motion and driving parameters of the vehicle in order to determine the state of the vehicle.

In the known configuration, the onboard device U is physically connected through dedicated wiring to an ignition and key start switch device of the vehicle K or to a similar electrical system node of the vehicle wherein an electrical voltage is present if, and only if, the vehicle key is turned to the activation position, and the vehicle (the engine and its relating accessories) is electrically powered by the charge accumulator.

Figure 3:
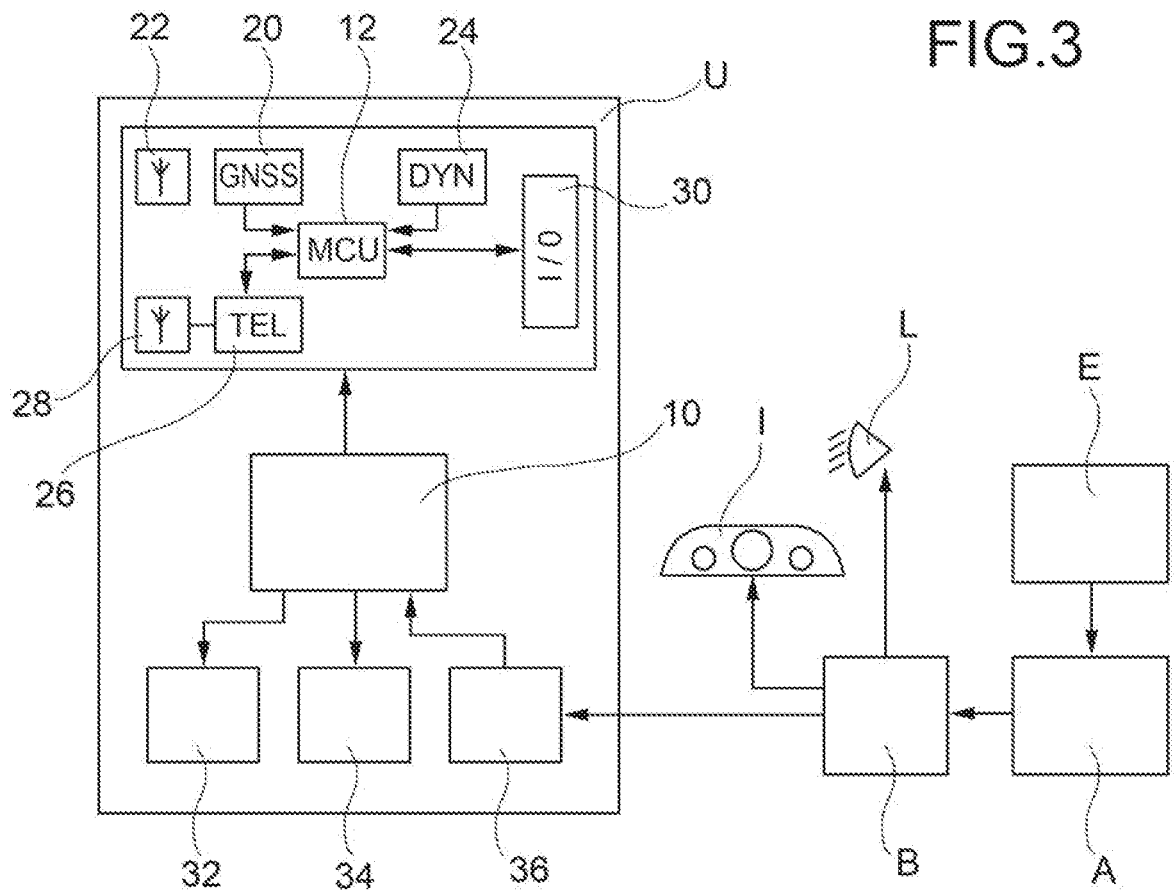
FIG. 3 is a functional block diagram of an illustrative, non-limiting embodiment of an onboard device for detecting data relating to the motion and driving parameters of a vehicle coupled to an electric charge accumulator assembly of the vehicle according to the invention.

FIG. 3 shows an illustrative block diagram in greater detail of an onboard device U according to the invention in the coupling configuration on board the vehicle according to the present invention.

The onboard device U includes a microprocessor 10 arranged for the acquisition and processing of data relating to the motion and driving parameters of the vehicle, acquired through an acquisition section, for example comprising a microcontroller 12 connected to a geographical positioning system 20, shown in the figure in association with its antenna 22, to a vehicle dynamics detection system 24, for example a system including one or more sensors such as position, tilt or acceleration sensors, arranged to provide accurate information on the positioning and orientation of the vehicle in space and on its displacement dynamics, and to a communication module 26, shown in the figure in association with the related antenna 28, adapted to exchange data to and from the telecommunication network N.

The onboard device U also includes an input and output interface 30 connected to the microcontroller 12 for connection to an onboard communication network of the vehicle, as a purely non-limiting and non-exclusive example, a CAN network, and remote communication modules 32, 34, such as Wi-Fi™ or Bluetooth™ communication modules, for connecting the microprocessor 10 to auxiliary devices, for example used to authenticate the vehicle's driver and/or to inhibit the startup of the vehicle when the driver is not authenticated.

The figure also shows a physical connection module 36 for connection to an electric charge accumulator assembly B of the vehicle, capable of bringing to the microprocessor a signal indicative of the voltage value that is established across the accumulator assembly.

For the sake of completeness in representation, the accumulator assembly B is shown in conjunction with a charge alternator A, driven by the vehicle's thermal engine E, and in conjunction with some illustrative loads such as an instrument panel I of the vehicle or the headlights L of the vehicle.

Figure 4:
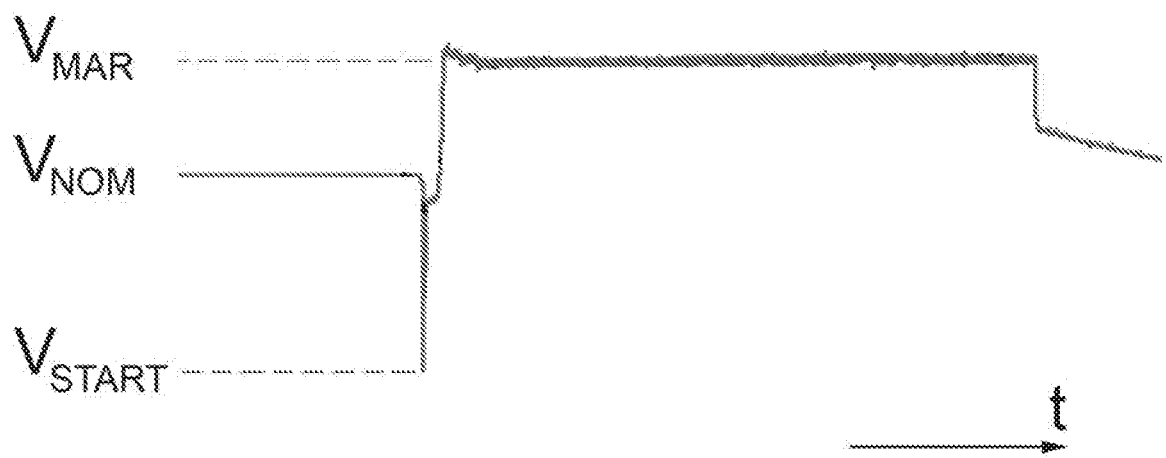
FIG. 4 is a diagram showing an illustrative trend over time of the voltage that is established across an accumulator assembly used for starting a vehicle's thermal engine and/or for powering the vehicle's accessory devices and rechargeable by means of the kinetic energy of the engine according to the aforementioned conditions.

FIG. 4 is a diagram showing an illustrative trend over time of the voltage that is established across an accumulator assembly B when it is used for starting a vehicle's thermal engine and/or for powering the vehicle's accessory devices and is rechargeable by means of the kinetic energy of the engine E by the alternator A. For an accumulator assembly having a nominal voltage of 12 volts, the voltage value present across the assembly in the vehicle's state of inactivity or rest is substantially equal to the nominal voltage $V_{NOM}$. When starting the vehicle's thermal engine, a large amount of electrical energy is drained from the accumulator and across the same, and for a limited time, on the order of the time necessary for starting the thermal engine of approximately 1-2 seconds, a sharp voltage drop is experienced, on the order of 2 volts with a peak of 3 volts, until the value $V_{START}$ is reached. Subsequently, when the vehicle is running and the kinetic energy of the thermal engine is used to recharge the accumulator assembly via the alternator A, the value of the voltage across the accumulator is higher than the nominal value, e.g. on the order of 14 volts, the average value being indicated as $V_{MAR}$, and affected by noise, until the vehicle's engine shuts off and returns to a state of inactivity (or rest), whereby the voltage across the accumulators decreases to the nominal value $V_{NOM}$.

According to the invention, the determination of the state of the vehicle by detecting the voltage that is established across the accumulator assembly as described above occurs by using at least one of the following binary classifiers, implemented within the microprocessor 10 by means of respective decision modules, which may be performed by separate processing means of the microprocessor, respectively configured to apply a corresponding binary classifier, or by means of common processing means, selectively configured to apply one of the binary classifiers or a combination thereof, the configuration of the processing means occurring by means of a computer program or a group of computer programs.

A first binary classifier is based on the detection of variations in the value of the voltage that is established across the accumulator assembly. This is arranged to determine an active engine state or a running vehicle state (hereinafter, ON state) if the difference between a short-term average of the voltage value across the accumulator assembly and a long-term average of the voltage value across the accumulator assembly is greater than a predetermined first transition threshold value. It is also arranged to determine an inactive engine state or a vehicle-at-rest state (hereinafter, OFF state) if the difference between a long-term average of the voltage value across the accumulator assembly and a short-term average of the voltage value across the accumulator assembly exceeds a predetermined second transition threshold value.

In algorithmic terms, the voltage value across the accumulator assembly is detected in a predetermined sequence of moments in time, for example, with a sampling period of 1 second if the device U is in low power operating mode or 1/10 of a second if the device U is in normal operating mode (i.e. non-low power consumption), wherein the reduction of sampling frequency in low power consumption conditions of the device U results from the need to respect energy-saving constraints, particularly in the event that the vehicle is not running, so that the accumulator assembly is not recharged.

Two averages of sets of these values are calculated, respectively one short-term average (V_fast), based on a number $n_{fast}$ of samples and a long-term average (V_slow) based on a number $n_{slow}$ of samples, where $n_{slow} \gg n_{fast}$.

If $$V\_fast - V\_slow > THRESHOLD_{off \to on}$$

where $THRESHOLD_{off \to on}$ is a first predetermined transition threshold value from an OFF state to an ON state, then the first binary classifier determines an ON state and V_slow=V_fast is set.

If $$V\_slow - V\_fast > THRESHOLD_{on \to off}$$

where $THRESHOLD_{on,off}$ is a second predetermined transition threshold value from an ON state to an OFF state, then the first binary classifier determines an OFF state and V_slow V_fast is set.

By way of example, following the analysis of the data collected by carrying out surveys on actual motor vehicles of several automobile manufacturers, the first transition threshold value (from the OFF state to the ON state) is between 0.3 V and 1 V and is preferably equal to 0.4 V, and the second transition threshold value (from the ON state to the OFF state) is between 0.3 V and 1 V and is preferably equal to 0.3 V. The number of samples $n_{fast}$ for the calculation of the short-term average is a function of the sampling period and extracted over a period of time, for example, between 6 and 7 seconds (preferably 6.4 seconds), and the number of samples $n_{slow}$ for the calculation of the long-term average is a function of the sampling period and extracted over a period of time, for example, between 13 and 15 minutes (preferably 13.7 minutes).

A second binary classifier is based on the detection of an absolute value of the voltage that is established across the accumulator assembly. The same is arranged to determine an active engine state or a running vehicle state (hereinafter, ON state) if the difference between the current voltage value across the accumulator assembly and a specified voltage value across the accumulator assembly, indicative of the voltage value across the accumulator assembly in an inactive engine state or a vehicle-at-rest state (hereinafter, OFF state), is greater than a predetermined reference threshold value of the differential voltage when the accumulator assembly is being charged. It is further arranged to determine an inactive engine state or a vehicle-at-rest state (hereinafter, OFF state), if such condition is not met.

In algorithmic terms, the voltage value across the accumulator assembly is detected following a specified time interval, on the order of 1-3 hours, wherein the vehicle has passed into the OFF state, for example for a period of approximately 8-10 hours.

A succession of voltage values is detected across the accumulator assembly in an inactive engine state or a vehicle-at-rest state (hereinafter, OFF state) and a very long period average $V_{rest}$ is calculated. This calculation is preferably performed only once during the life cycle of the onboard device of a given vehicle and serves to determine the voltage value across the accumulator assembly in an inactive engine state or a vehicle-at-rest state.

Therefore, if:

$$V_{current} - V_{rest} > THRESHOLD_{V\_battery}$$

where $V_{current}$ is the current voltage value across the accumulator assembly and $THRESHOLD_{V\_battery}$ is a predetermined reference threshold of the differential voltage when the accumulator assembly is charging, then the second binary classifier determines an ON state, otherwise it determines an OFF state.

Advantageously, if the $V_{rest}$ item of data is unavailable, the algorithm uses an absolute threshold $V_{Rest\_default}$. This may happen under the following conditions:
  The calculation of $V_{rest}$ was not completed;
  a failure of the external power supply to the onboard device was detected (in this case, the calculation is canceled and executed again as it is assumed that the device is installed on a different vehicle);
  the item of data was lost because it was deleted from the memory due to a lack of power to the memory module wherein it was stored.

By way of example, the reference threshold value of the differential voltage when the accumulator assembly is charging is between 0.6 V and 1 V and preferably 0.8 V.

A third binary classifier is based on the detection of a drop in the voltage established across the accumulator assembly when the accumulator assembly powers a starter device of the vehicle's thermal engine. This is arranged to determine a transition from the inactive engine state or vehicle-at-rest state (OFF state) to the active engine state or a running vehicle state (hereinafter, ON state) if the difference between a voltage value across the accumulator assembly in an inactive engine state or a vehicle-at-rest state and a current voltage value across the accumulator assembly is greater than a predetermined value of a voltage drop reference threshold for a voltage drop time interval between a minimum voltage drop time interval and a maximum voltage drop time interval.

In algorithmic terms, a sequence of voltage values is detected across the accumulator assembly in an inactive engine state or a vehicle-at-rest state (hereinafter, OFF state) and a very long-term average $V_{rest}$ is calculated. This calculation is preferably performed only once during the life cycle of the onboard device of a given vehicle and serves to determine the voltage value across the accumulator assembly in an inactive engine state or a vehicle-at-rest state.

When a starter device of the vehicle's thermal engine absorbs current from the accumulator assembly for a time span on the order of tenths of a second, the voltage that is established across the accumulator assembly decreases rapidly and then increases again when the engine is started, creating a "bathtub-shaped" signal.

Therefore, indicating with $V_{current}$ the current voltage value across the accumulator assembly, if:

$$V_{rest} - V_{current} > THRESHOLD_{Drop}$$

where THRESHOLD$_{Drop}$ is a predetermined reference threshold value of the voltage drop for a time $t_{Drop}$ and $$T_{Drop}{}^{Min} < t_{Drop}{}^{Max} < T_{Drop}{}^{Max}$$

then the third binary classifier determines an ON state.

Since in the low-power condition of the onboard device the voltage sampling frequency that is established across the accumulator assembly is too low, this classifier works only if the onboard device is not in the low-power state, e.g. if another classifier has already awakened the onboard device.

By way of example, the reference threshold value of the voltage drop is between 0.3 V and 1 V and is preferably equal to 0.5 V, while the time interval for detecting it is between 5 and 10 seconds.

A fourth binary classifier, supplementary to the previous binary classifiers, is based on the detection of a vehicle's movement condition. It is arranged to determine an active engine state or a running vehicle state (hereinafter, ON state) if a motion energy value, estimated as a time average of the sum of the contributions on the axes of a Cartesian reference system of the difference between an instantaneous acceleration value and an average acceleration value for each axis, is greater than a predetermined threshold value of the motion energy. It is also arranged to determine an inactive engine state or a vehicle-at-rest state (hereinafter, OFF state) if such condition is not met.

In algorithmic terms, the value of a first moving average of the vehicle's acceleration is calculated or acquired along each of a set of Cartesian axes of a predetermined reference system, for example a reference system aligned to the longitudinal direction of the vehicle or a reference system of the onboard device, which houses a detection system of the dynamics of the vehicle 24, in a succession of moments in time, for example over a period of 20 seconds.

Therefore:

$$\text{Offset}^X = \text{average}_{20sec} \text{ Of}(\text{ACC}_{instantaneous}{}^X)$$

$$\text{Offset}^Y = \text{average}_{20sec} \text{ Of}(\text{ACC}_{instantaneous}{}^Y)$$

$$\text{Offset}^Z = \text{average}_{20sec} \text{ Of}(\text{ACC}_{instantaneous}{}^Z)$$

A second moving average is subsequently calculated, for example, always for a period of 20 seconds, of the differences between the instantaneous acceleration of the vehicle along each Cartesian axis and the first moving average:

$$\text{Energy} = \text{average}_{20sec} \text{ of } \Sigma^{X,Y,Z}(\text{Acc}_{instantaneous}{}^i - \text{Offset}^i)$$

with i=X, Y, Z
If:

$$\text{Energy} > \text{Threshold}_{Energy}$$

where Threshold$_{Energy}$ is a threshold value of motion energy, then the fourth binary classifier determines an ON state, otherwise it determines an OFF state.

By way of example, the motion energy threshold value is between 40 mJ and 60 mJ and preferably equal to 48 mJ.

Advantageously, all the described binary classifiers are filtered by a so-called debounce mechanism, whereby the determination of the ON state (or OFF state) is enabled only if the condition controlled by the classifier remains unchanged for a predetermined time interval. For example, for the first classifier means, the interval in the transition from the OFF state to the ON state is preferably 5 seconds and the interval in the transition from the ON state to the OFF state is preferably 2 seconds. By way of a further example, for the fourth classifier means, the interval in the transition from the OFF state to the ON state is preferably 10 seconds and the interval in the transition from the ON state to the OFF state is 180 seconds.

Figure 5:
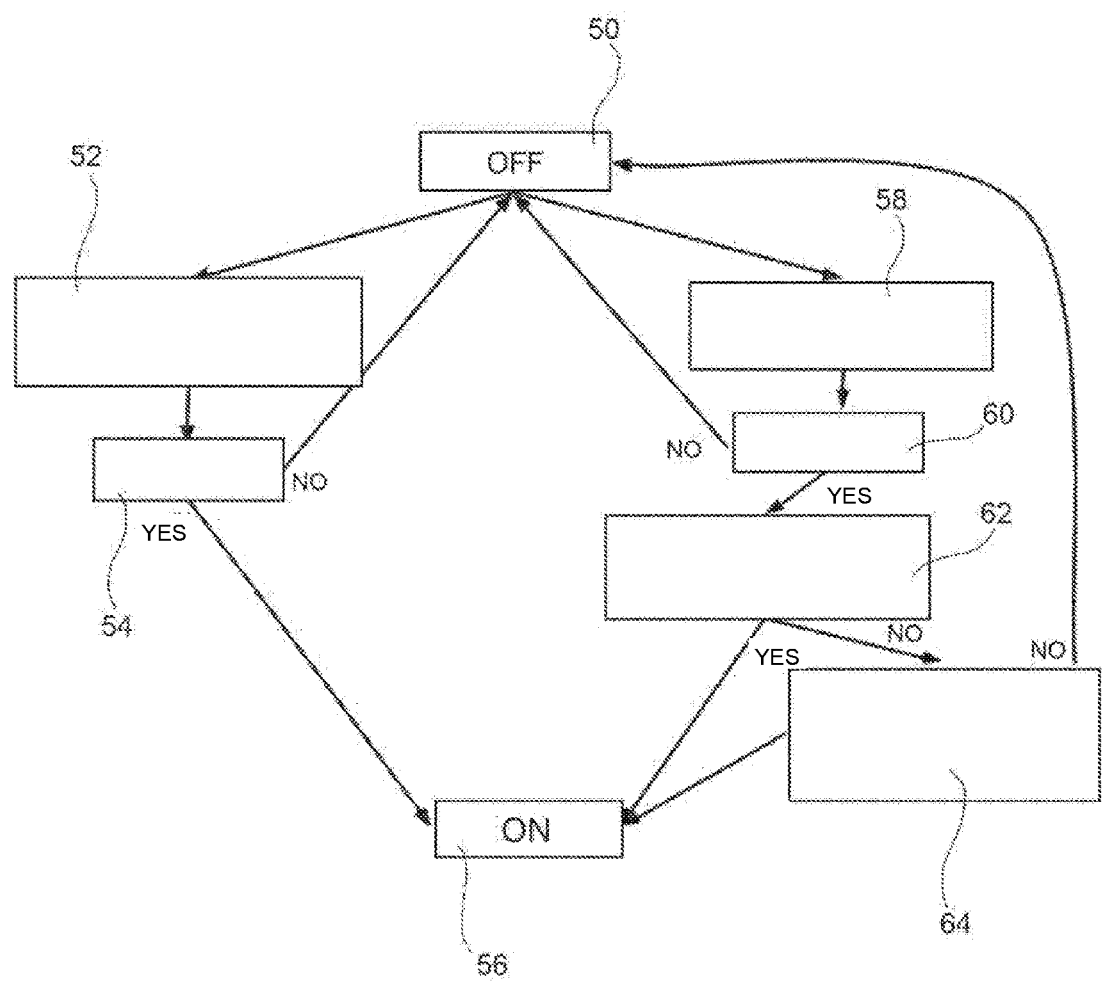
FIGS. 5, 6 and 7 are flow charts of illustrative embodiments of the method of the invention.

In a preferred embodiment, the determination of the transition from an inactive engine or a vehicle-at-rest state (OFF state) to an active engine or running vehicle state (ON state) is shown in FIG. 5.

The state indicated at 50 represents an initial condition of a vehicle at rest, wherein the vehicle-at-rest state is determined, for example, by the method of the present invention.

Following the detection of an increase in the voltage that is established across the accumulator assembly, the first binary classifier determines at step 52 a possible transition to the running vehicle state, which is enabled if the permanence of the detected condition for a time interval is confirmed at step 54. If such permanence is confirmed, the transition to the running vehicle state is acquired, indicated in the figure by the state 56. In the event that at step 54 the permanence of the condition detected by the first classifier for the entire time interval is not confirmed, the onboard device does not recognize any transition and returns to the state 50.

Alternatively to, or in combination with, the detection of a movement of the vehicle at step 58, the fourth binary classifier determines a possible transition to the running vehicle state, which is enabled if the permanence of the condition detected for a time interval is confirmed at step 60. If such permanence is confirmed, at step 62 the second binary classifier is applied, otherwise the onboard device does not recognize any transition and returns to the state 50. At the detection of a voltage value across the accumulator assembly, the second classifier determines the state of the vehicle at step 62, as illustrated above. If the condition is confirmed, the onboard device recognizes the transition to the running vehicle state, indicated in the figure by the state 56. Otherwise, the third binary classifier is applied at step 64. The third classifier determines the state of the vehicle at step 64. If the condition is confirmed, the onboard device recognizes the transition to the running vehicle state, shown in the figure by the state 56. Otherwise, the onboard device determines that no transition from the OFF state to the ON state has occurred and returns to the initial condition of the vehicle-at-rest state 50 (OFF state).

Figure 6:
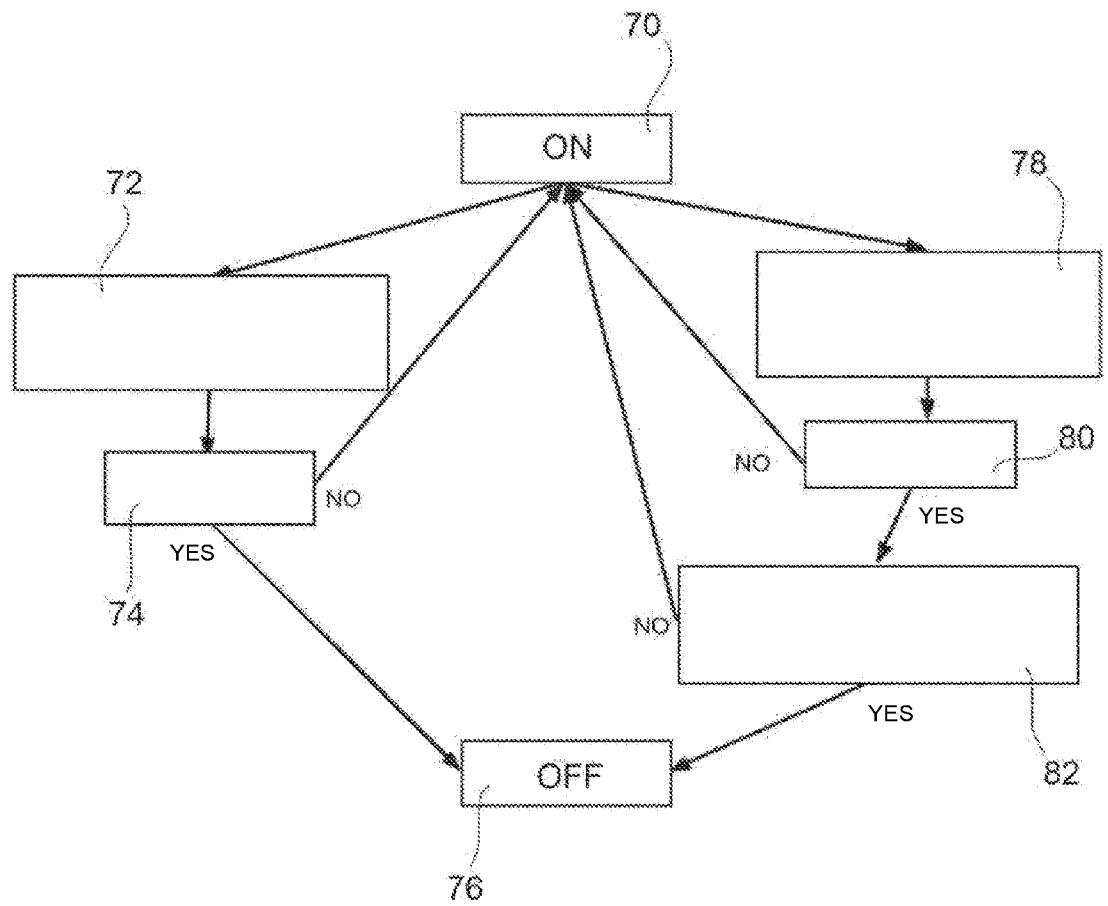

In a preferred embodiment, the determination of the transition from an active engine or a running vehicle state (ON state) to an inactive engine or vehicle-at-rest state (OFF state) is shown in FIG. 6.

The state indicated at 70 represents an initial condition of a running vehicle, wherein the running vehicle state is determined, for example, by the method of the present invention. At the detection of the absence of movement of the vehicle, the fourth binary classifier determines a possible transition to the vehicle-at-rest state at step 72, which is enabled if the permanence of the detected condition for a time interval is confirmed at step 74. If such permanence is confirmed, the transition to the vehicle-at-rest state indicated at 76 is acquired, otherwise the onboard device does not recognize any transition and returns to the state 70.

Alternatively to, or in combination with, the detection of a decrease in the voltage that is established across the accumulator assembly, the first binary classifier determines at step 78 a possible transition to the vehicle-at-rest state, a determination which is enabled if the permanence of the detected condition for a time interval is confirmed at step 80. In this case, the onboard device detects a motion energy value by means of the vehicle's dynamics detection system 24 and the fourth binary classifier determines a possible transition to the vehicle-at-rest state at step 82, and, in the case of an affirmative response, determines the vehicle's transition to the rest state 76. In the event that at step 80 the permanence of the condition detected by the first classifier for the entire time interval is not confirmed, or a possible transition to the vehicle-at-rest state is not subsequently determined at step 82, the onboard device does not recognize any transition and returns to the state 70.

Advantageously, it is desirable to evaluate the reliability and improve the precision of the method of the invention by carrying out a preliminary testing step wherein the method is carried out on a vehicle equipped with an ignition and key start switch device, in order to compare the determinations made by the method described with those resulting from the analysis of the signals obtainable by means of a physical link to the ignition and key start switch device or the vehicle's CAN bus. The optimization of the individual binary classifiers is thus based on a field measurement of real data at transitions of the signal obtainable by means of a physical link to the ignition and key start switch device or the physical CAN bus.

The effectiveness of each binary classifier may be measured in terms of:
1. accuracy: the classifier is accurate if its determination coincides with the actual state;
2. responsiveness: a classifier may be reliable but not responsive, meaning it may correctly signal a vehicle's transition of state but with a delay $T_{delay}$.

Appropriately, beyond a limit delay, designated as Threshold$_{Delay}^{Dec}$, a classifier may not be used as a primary classifier, but only in combination with other classifiers (secondary classifier).

Advantageously, further optimization may be achieved by exploiting the best combination between the various classifiers, whereby the determination of a state transition occurs in the following terms:

$$\text{State}_{On} \text{ if } a_1 \text{Dec}_1 + \ldots + a_n \text{Dec}_n > \text{Threshold}_{off \to on}$$

$$\text{State}_{off} \text{ if } a_1 \text{Dec}_1 + \ldots + a_n \text{Dec}_n < \text{Threshold}_{on \to off}$$

where $\text{Dec}_i$ is the output of the individual binary classifier (or decider), which may be 0 or 1, and $a_1 \text{Dec}_1 + \ldots + a_n \text{Dec}_n$ is a linear combination of determinations of individual binary classifiers.

The coefficients $a_1, \ldots, a_n$ may be chosen initially based on a predetermined confidence level of the individual classifier, i.e. the more a classifier is accurate (for example, based on the preliminary test step described above), the higher its weight. Alternatively, these may be estimated using a ROC (Receiver Operating Characteristic) curve analysis, one for each ON→OFF and OFF→ON transition, operated by varying the coefficient values $a_1, \ldots, a_n$ in order to find the best combination $a_1, \ldots, a_n$ that brings the two ROC curves (Off→On case and On→Offcase) closer to the ideal case, where the coefficients $a_1, \ldots, a_n$ relating to the individual classifiers are determined separately in the two cases Off→On and On→Off.

The method of the invention may therefore advantageously be performed in two steps or decisional blocks:
1. pre-decision: based on only one of the "primary" classifiers, privileges the responsiveness of the mechanism;
2. decision: based on the weighted combination of determinations of the various classifiers and assures the accuracy of the mechanism;

wherein the decision step has priority over the pre-decision step, which may not even be carried out.

Figure 7:
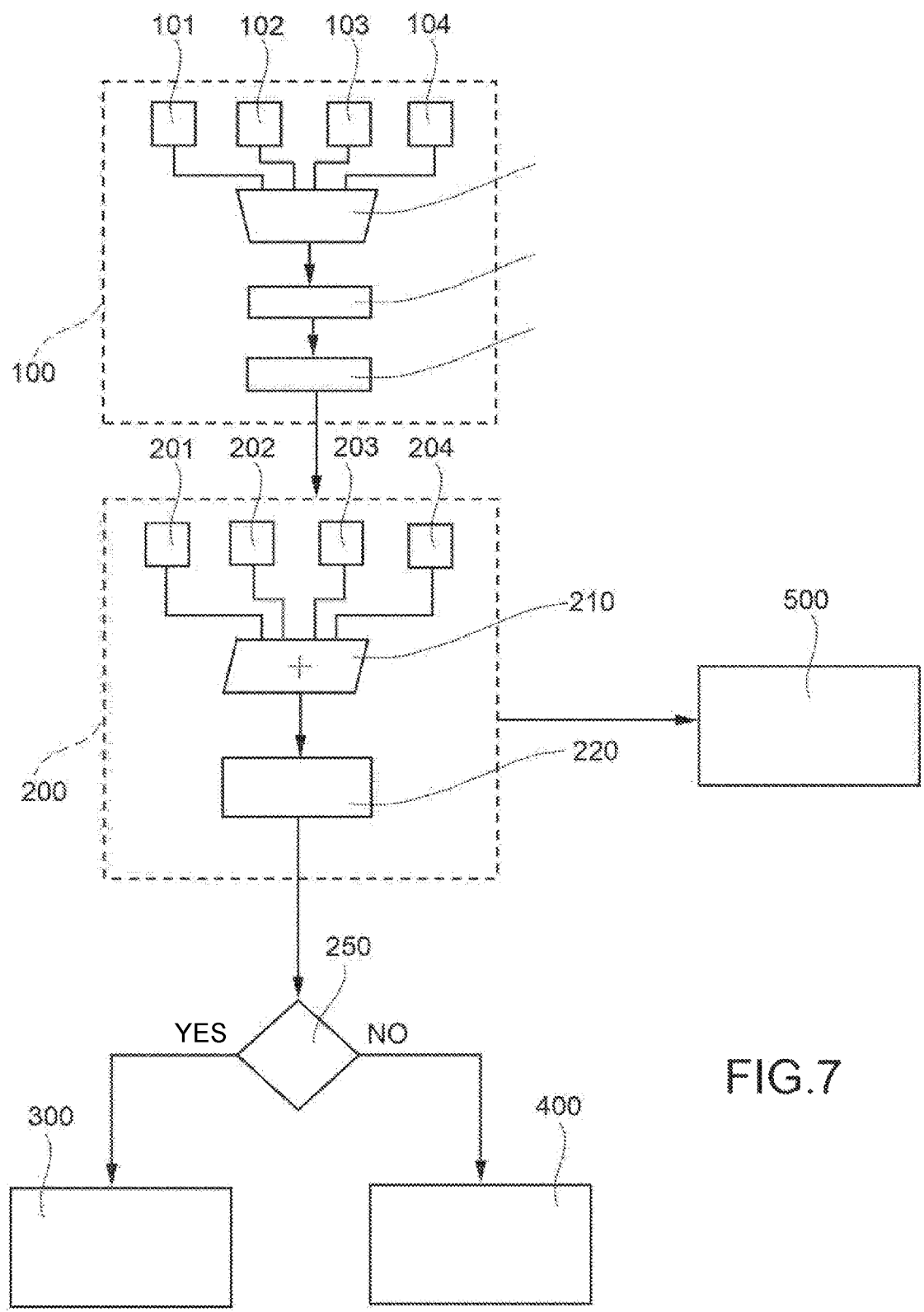

A method including two steps or decision blocks is illustrated with reference to FIG. 7.

In a first pre-decision step 100 a classifier selected from the primary binary classifiers described above estimates a transition of the state of the vehicle, which is used to determine a switching hypothesis from the OFF state to the ON state of the vehicle or vice versa, i.e. a hypothesis of start or end of a travel of a vehicle.

This information may be stored locally on a memory module (not shown) or communicated by the onboard device U to the central unit C. In detail, a plurality of binary classifiers are indicated respectively at 101, 102, 103 and 104, only one of which is selected by means of a selection operation at step 110, which may be carried out as a selection of one of a plurality of signals issued by binary classifiers all executed by the onboard device's processing unit 10 or as the execution of a single predetermined binary classifier.

In a subsequent step 120, the determination of the selected binary classifier is confirmed for a predetermined time interval and at step 130 the result of the estimate of the vehicle's state is provided.

This information is passed to the next decision step, indicated at 200 in the figure. In the box indicated at 200, the operations performed are shown in detail, which include the execution of the binary classification procedures described above, indicated here at 201, 202, 203 and 204 and their weighted combination at step 210. Therefore, at step 220, the weighted combination at step 210 is compared with a predetermined reference global transition threshold, for example predetermined according to the current weights of the aforementioned combination.

Within an acceptable delay time interval, the method of the invention compares (step 250) the determination of the vehicle state after the decision step with the estimate of the vehicle state determined as a result of the pre-decision step, whereby it approves (in case of consistency) or rejects (in case of inconsistency) the estimated determination of the vehicle state.

In the event that the outcome of the comparison between the determination of the pre-decision step 100 and the decision step 200 determines the recognition of a consistent transition condition, the method proceeds with an approval operation 300 of the transition condition, whereby the state of the vehicle is determined definitively and the corresponding start or end of travel condition is stored and/or communicated to the remote central unit C.

Otherwise, that is, if the determinations of the pre-decision step 100 and the decision step 200 are not consistent, the method proceeds with a rejection condition 400 of the transition condition, where the estimated transition in the pre-decision step is discarded. Potentially, if this transition has previously been communicated to the remote central unit, the discard decision is also communicated to the remote central unit.

Advantageously, a self-diagnosis step 500 is provided, with the object of improving the resilience of the method to individual malfunctions. If a binary classifier contradicts, for a certain number of consecutive events, the other classifiers in the decision step 200, the relative weight $a_i$ is progressively reduced until it is possibly disabled ($a_i=0$) in the weighted combination at step 210, and the weight of other classifiers is increased to maintain unaltered the global reference transition threshold. Furthermore, the probable malfunction is indicated to the remote central unit C.

Advantageously, if one or more primary binary classifiers do not intervene promptly for a number of consecutive events in the pre-decision step 100, this condition is indicated as an anomaly to the remote central unit C.

From the foregoing, it is apparent that an onboard device of the type described above allows the predefined objects to be fully obtained in terms of overcoming the drawbacks of the prior art.

Naturally, without altering the principle of the invention, the embodiments and the details of implementation may vary widely with respect to that which is described and illustrated purely by way of non-limiting example, without thereby departing from the scope of protection of the invention defined by the appended claims.

The invention claimed is:

1. A method for determining an operating state of a vehicle equipped with an electric charge accumulator assembly adapted to supply at least a starter device of a thermal engine and/or accessory devices of the vehicle and rechargeable by means of the kinetic energy of said engine, the method comprising:
   detecting the voltage value established across the electric charge accumulator assembly of the vehicle in a predetermined succession of moments in time;
   performing at least two of a plurality of binary classifications of the voltage value established across the accumulator assembly by comparison with a reference voltage value, said at least two of said plurality of binary classifications selected from the following:
   (a) determination of an active engine state or a running vehicle state responsive to a difference between a short-term average of the voltage value across the accumulator assembly and a long-term average of the voltage value across the accumulator assembly being greater than a predetermined first transition threshold value; and determination of an inactive engine state or a vehicle-at-rest state responsive to a difference between a long-term average of the voltage value across the accumulator assembly and a short-term average of the voltage value across the accumulator assembly being greater than a predetermined second transition threshold value;
   (b) determination of an active engine state or a running vehicle state responsive to a difference between a current voltage value across the accumulator assembly and a long-term average of the voltage value across the accumulator assembly, indicative of the voltage value across the accumulator assembly in an inactive engine state or a vehicle-at-rest state, being greater than a predetermined reference threshold value of the differential voltage when the accumulator assembly is being charged; and determination of an inactive engine state or a vehicle-at-rest state, otherwise;
   (c) determination of an active engine state or a running vehicle state responsive to a difference between a voltage value across the accumulator assembly in an inactive engine state or a vehicle-at-rest state and a current voltage value across the accumulator assembly being greater than a predetermined value of a voltage drop reference threshold for a voltage drop time interval comprised between a minimum voltage drop time interval and a maximum voltage drop time interval;
   the method further comprising:
   determining the operating state of the vehicle as a function of a weighted combination of at least two of the plurality of binary classifications of the voltage value established across the accumulator assembly;
   reducing a weight of one of the at least two of the plurality of binary classifications in said weighted combination responsive to the one of the at least two of the plurality of binary classifications contradicting the others of the plurality of binary classifications for a predetermined number of consecutive events; and
   responsive to the reducing, communicating, by an on board device to a central remote unit, a possible malfunction.

2. The method according to claim 1, wherein said reference voltage value is a value of the voltage across the accumulator assembly in a vehicle-at-rest condition.

3. The method according to claim 1, wherein said comparison of the voltage value established across the accumulator assembly with the reference voltage value is performed in a predetermined time interval.

4. The method according to claim 1, wherein the determination of the operating state of the vehicle as a function of the outcome of said weighted combination of at least two of the plurality of binary classifications of the voltage value established across the accumulator assembly is enabled if the outcome of said at least binary classifications remains unchanged for a time interval having a predetermined duration.

5. The method according to claim 1, comprising reduction of a weight of one of the at least two of the plurality of binary classifications in said weighted combination responsive to the one of the at least two of the plurality of binary classifications contradicting the others of the plurality of binary classifications for a predetermined number of consecutive events.

6. The method according to claim 1, comprising a preliminary step of estimating the state of the vehicle as a function of a preselected one of the at least two of said plurality of binary classifications.

7. An onboard device for detecting data relating to motion and driving parameters of a vehicle, comprising a processing system for determining the state of the vehicle, the processing system comprising a microprocessor and non-transitory computer readable medium containing one or more computer programs comprising computer instructions which, when executed, perform the method according to claim 1.

8. A non-transitory computer readable medium containing one or more computer programs comprising computer instructions which, when executed by a processing system of an onboard device for detecting data relating to motion and driving parameters of a vehicle, perform the method according to claim 1.

9. The method according to claim 1, wherein said reference voltage value is a value of the voltage across the accumulator assembly in a vehicle-at-rest condition.

10. The method according to claim 1, wherein said comparison of the voltage value established across the accumulator assembly with the reference voltage value is performed in a predetermined time interval.

* * * * *